United States Patent [19]
Heegard et al.

[11] Patent Number: 5,703,887
[45] Date of Patent: Dec. 30, 1997

[54] SYNCHRONIZATION AND ERROR DETECTION IN A PACKETIZED DATA STREAM

[75] Inventors: Chris Heegard, Ithaca, N.Y.; Andrew J. King, Phoenix, Ariz.; Sydney Lovely, Phoenix, Ariz.; Thomas J. Kolze, Phoenix, Ariz.

[73] Assignee: General Instrument Corporation of Delaware, Chicago, Ill.

[21] Appl. No.: 363,252

[22] Filed: Dec. 23, 1994

[51] Int. Cl.$^6$ .................. H03M 13/00; H04L 7/00
[52] U.S. Cl. .................................................. 371/42
[58] Field of Search .................. 371/37.1, 42, 47.1

[56] References Cited

U.S. PATENT DOCUMENTS

| | | | |
|---|---|---|---|
| 3,336,467 | 8/1967 | Frey, Jr. | 371/42 |
| 4,468,770 | 8/1984 | Metcalf et al. | 371/42 |
| 5,131,012 | 7/1992 | Dravida | 375/108 |
| 5,267,249 | 11/1993 | Dong | 371/42 |
| 5,280,484 | 1/1994 | Weis | 370/102 |
| 5,282,215 | 1/1994 | Hyodo et al. | 371/42 |
| 5,367,544 | 11/1994 | Bruekheimer | 375/116 |

OTHER PUBLICATIONS

ITU-T Recommendation I.432, ISDN User–Network Interfaces, "B–ISDN User–Network Interface—Physical Layer Specification," Mar., 1993.

Wicker, S., Error Control Systems for Digital Communication and Storage, pp. 112–116, Oct. 1995.

Lei, S–M., "Forward Error Correction Codes for MPEG2 over ATM", IEEE Trans. on Circuits and Systems for Video Technology, vol. 4, No. 2, pp. 200–203, Apr. 1994.

Blahut, R., Theory and Practice of Error Control Codes, pp. 133–137, May 1984.

Peterson, W., et al., Error–Correcting Codes, 2nd edition, pp. 170–205, Jul. 1981.

*Primary Examiner*—Stephen M. Baker
*Attorney, Agent, or Firm*—Barry R. Lipsitz; Ralph F. Hoppin

[57] ABSTRACT

A method and apparatus are provided for achieving synchronization and detecting errors in a data stream such as an MPEG-2 transport packet stream. In an MPEG embodiment, the MPEG sync word is removed and replaced with a parity code that is used at the decoder for both synchronization and error detection. A syndrome calculator in the decoder can be implemented using a unique one bit in, one bit out FIR filter. Codewords used to generate the parity code can be provided by a linear block code that is a dual of a shortened cyclic code.

24 Claims, 7 Drawing Sheets

SYNCHRONIZATION AND ERROR DETECTION IN A PACKETIZED DATA STREAM

BACKGROUND OF THE INVENTION

The present invention relates to a method and apparatus for achieving synchronization and detecting errors in a data stream, and more particularly to a method and apparatus for synchronization and error detection of an MPEG encoded data stream or the like.

The Motion Picture Experts Group (MPEG) has proposed a standard for the transport of digital data. The MPEG-2 standard is widely known and recognized as a video and audio compression specification, and has been sanctioned by the International Standards Organization (ISO) in document ISO 13818. The MPEG-2 specification also contains a systems "layer" that provides a transmission medium independent coding technique to build bitstreams containing one or more MPEG programs. The MPEG coding technique uses a formal grammar ("syntax") and a set of semantic rules for the construction of bitstreams to be transmitted. The syntax and semantic rules include provisions for multiplexing, clock recovery, synchronization, and error resiliency.

The MPEG transport stream is specifically designed for transmission in conditions that can generate data errors. MPEG transport packets each have a fixed length of 188 bytes. Many programs, each with different components, may be combined in a transport stream. Examples of services that can be provided using the MPEG format are television services broadcast over terrestrial, cable television or satellite networks as well as interactive telephony-based services. The primary mode of data transmission in MPEG broadcast applications will be the MPEG-2 transport stream. The syntax and semantics of the MPEG-2 transport stream are defined in the MPEG-2 Systems Committee draft, ISO/IEC JTC1/SC29/WG11/N0601, November, 1993.

Multiplexing according to the MPEG-2 standard is accomplished by packaging raw elementary streams such as coded video and audio into packetized elementary stream (PES) packets which are then inserted into transport packets. As noted above, each transport packet is fixed at 188 bytes in length. The first byte is a synchronization byte having a unique eight-bit pattern, e.g., 01000111. The sync byte is used to locate the beginning of each transport packet.

The sync byte is followed by a three-byte prefix containing a transport packet error indicator, payload unit start indicator, transport priority bit, packet identifier (PID), transport scrambling control, adaptation field control and a continuity counter. Use of the sync byte and three prefix bytes leave up to 184 bytes in the transport packet for the actual data to be communicated, referred to as the "payload." An optional adaptation field may follow the prefix, to carry both MPEG related and private information of relevance to a given transport stream or the elementary stream carried within a given transport packet. Whenever an adaptation field is present, the number of bytes in the payload will be reduced by the number of bytes used by the adaptation field. Further details of the MPEG-2 transport specification can be found in A. J. Wasilewski, "MPEG-2 Systems Specification: Blueprint for Network Interoperability," *Communications Technology*, February, 1994, pp. 30–44.

In the MPEG standard, the synchronization byte at the beginning of each transport packet is used merely to acquire synchronization at the decoder. The decoder searches a received serial bitstream formed from successive transport packets to locate a match with the unique synchronization byte. The MPEG synchronization byte (01000111) was chosen due to its excellent aperiodic autocorrelation properties and because it is not easily emulated by PID values from the low end of the range. Upon finding a first synchronization byte, a typical decoder will initially assume it is a valid synchronization byte and subsequently determine if another such byte is received after the next 187 bytes of the serial bitstream have passed. After two or more successive synchronization bytes are located where expected, it is assumed that synchronization has been achieved, and that the data between the synchronization bytes comprises the prefix, adaptation field (if present) and payload of a transport packet. The payload data is processed in a conventional manner to recover the transmitted information.

It would be advantageous to provide a method and apparatus for utilizing the information bearing capacity of a synchronization byte in a transport stream such as an MPEG-2 transport stream. More particularly, it would be advantageous to provide an error detection capability in addition to the packet alignment information supplied by the synchronization byte. It would be still further advantageous to provide a simplified decoder for processing error detection information provided by the sync byte in order to identify those transport packets containing errors.

The present invention provides a method and apparatus having the aforementioned advantages in which parity checksums are used instead of sync bytes in successive transport packets. Linear block codes (LBCs) are generated for which the parity check equations can be implemented in a single finite impulse response (FIR) filter. By implementing the parity check equations in a single FIR filter, the cost and complexity of the decoder used for synchronization and error detection can be greatly reduced.

SUMMARY OF THE INVENTION

In accordance with the present invention, a method is provided for achieving synchronization and detecting errors in a data stream carrying successive packets of k information bits and r synchronization bits. The synchronization bits of each packet comprise a predefined, searchable pattern. At least one synchronization pattern is located in the data stream to enable the boundaries for the k information bits of successive packets to be determined. In one embodiment, the synchronization pattern in each packet is replaced with an r-bit parity code derived from a counterpart set of k information bits in the data stream, thereby generating a modified data stream. The modified data stream is communicated to a decoder. At least one of the parity codes is located in the modified data stream at the decoder to achieve synchronization. This enables the boundaries for the k information bits of successive packets to be determined. Once synchronization has been achieved, the parity codes are compared to checksums obtained from their counterpart k information bits at the decoder to determine when the information bits in a received packet contain an error.

The data stream can comprise an MPEG compatible data stream, e.g., an MPEG-2 data stream or a similarly formatted data stream. The parity codes can be scaled such that when decoded at the decoder, they will match MPEG synchronization patterns. In an MPEG-2 embodiment, the number of information bits (prefix, adaptation field and payload) in a packet is k=1496. In a preferred MPEG implementation, the synchronization pattern for each packet precedes the k information bits of that packet, whereas the counterpart set of k information bits for each parity code comprises the k information bits immediately preceding the parity code. The parity code can be generated from a linear block code comprising a dual of a shortened cyclic code.

Communication apparatus in accordance with the present invention enables a receiver to robustly obtain synchronization and detect errors in a data stream carrying successive packets of k information bits and an r-bit parity code. The parity code of each packet comprises a predefined pattern of bits detectable at the receiver by searching for the pattern. The parity code also functions as a checksum for information bits carried in the data stream. The apparatus comprises means for inserting the parity codes in the packets prior to communication to the receiver. Each of the parity codes is derived from a counterpart set of k information bits in the data stream. Means are provided for communicating the data stream to the receiver after insertion of the parity codes. At least one parity code is located in the data stream at the receiver to achieve synchronization. This enables the boundaries for the k information bits of successive packets to be determined. In accordance with the invention, the receiver also includes means for comparing the parity codes to checksums obtained from their counterpart k information bits to determine when the information bits in a packet contain an error.

The data stream into which the parity codes are inserted can comprise, for example, an MPEG compatible data stream in which successive transport packets each commence with a synchronization pattern followed by the k information bits. In such an instance, the apparatus can further comprise means for replacing the synchronization patterns with the parity codes to provide a modified data stream for communication to the receiver. In an illustrated embodiment, each parity code that is substituted for the synchronization pattern is derived from the k information bits of the preceding packet. Thus, whereas the synchronization pattern for each transport packet is at the beginning of the packet and is followed by the k information bits carried by that packet, the parity code that is substituted for the synchronization pattern is derived from the previous k information bits, which are carried by the preceding packet.

The parity codes can be scaled at the encoder so that when decoded at the receiver, they will match an MPEG synchronization pattern. The receiver can further comprise means for reconstructing the data stream from the modified data stream by replacing the parity codes with the synchronization patterns, after the parity codes have been used to obtain synchronization and detect errors. In the illustrated embodiment, a parity check matrix is provided at the receiver for generating a predefined synchronization pattern from valid parity codes. The predefined synchronization pattern can comprise, for example, a standard MPEG synchronization pattern.

The present invention also provides a decoder for a packetized digital data stream. The data stream contains successive packets, each having k information bits and an r-bit parity code. The parity code of each packet is derived from k bits of information carried by the data stream. The decoder includes means for searching the data stream during a signal acquisition phase to locate a parity code contained therein. Means are provided for establishing a synchronization condition based on one or more parity codes located by the searching means. A checksum derived from the k information bits of each packet is compared to the parity code for those k information bits during a tracking phase. Means are provided for signaling an error in the k information bits for a packet when the checksum for those bits does not match the parity code therefor.

The decoder can further comprise means for monitoring the parity codes during the tracking phase. Means responsive to the monitoring means are provided for switching from the tracking phase to the acquisition phase after a predetermined plurality of r-bit patterns considered by the monitoring means to be parity codes are found to be invalid.

Where the data stream is encoded in an MPEG compatible format, the decoder can further comprise means for replacing the parity code in each packet with an MPEG synchronization pattern after the parity code has served its purpose for acquisition and error detection. The parity code can be derived from the k information bits of the immediately preceding packet, whereas each synchronization pattern comprises the first r bits in a packet and is followed by the k information bits for that packet. In an illustrated embodiment, the parity codes are generated from a linear block code comprising a dual of a shortened cyclic code.

The invention also provides apparatus for calculating syndromes for linear block coded codewords. The apparatus comprises a finite impulse response filter having an input for receiving a serial bitstream of codeword data, each codeword containing k information bits and r parity bits, said filter having an output for providing a serial bitstream of syndromes. The syndromes comprise a fixed linear combination of a current bit of said codeword data input to said filter and the k previous bits of said codeword data. The filter has an impulse response $h^{k+1}(x)$, where:

$$h^{k+1}(x) = \frac{a(x) - x^{k+1}b(x)}{g(x)},$$

g(x) is a generator polynomial of degree r describing a recursion, and a(x) and b(x) are polynomials chosen such that the polynomial $h^{k+1}(x)$ will be of degree k, have a non-zero constant term $h_o=1$, and have a non-zero final term $h_k=1$.

The linear block code used to generate the codewords for which the syndromes are calculated can comprise a dual of a shortened cyclic code. Means can be provided at the output of the filter for detecting a synchronization pattern in the serial bitstream of syndromes.

DETAILED DESCRIPTION OF THE INVENTION

Figure 1:
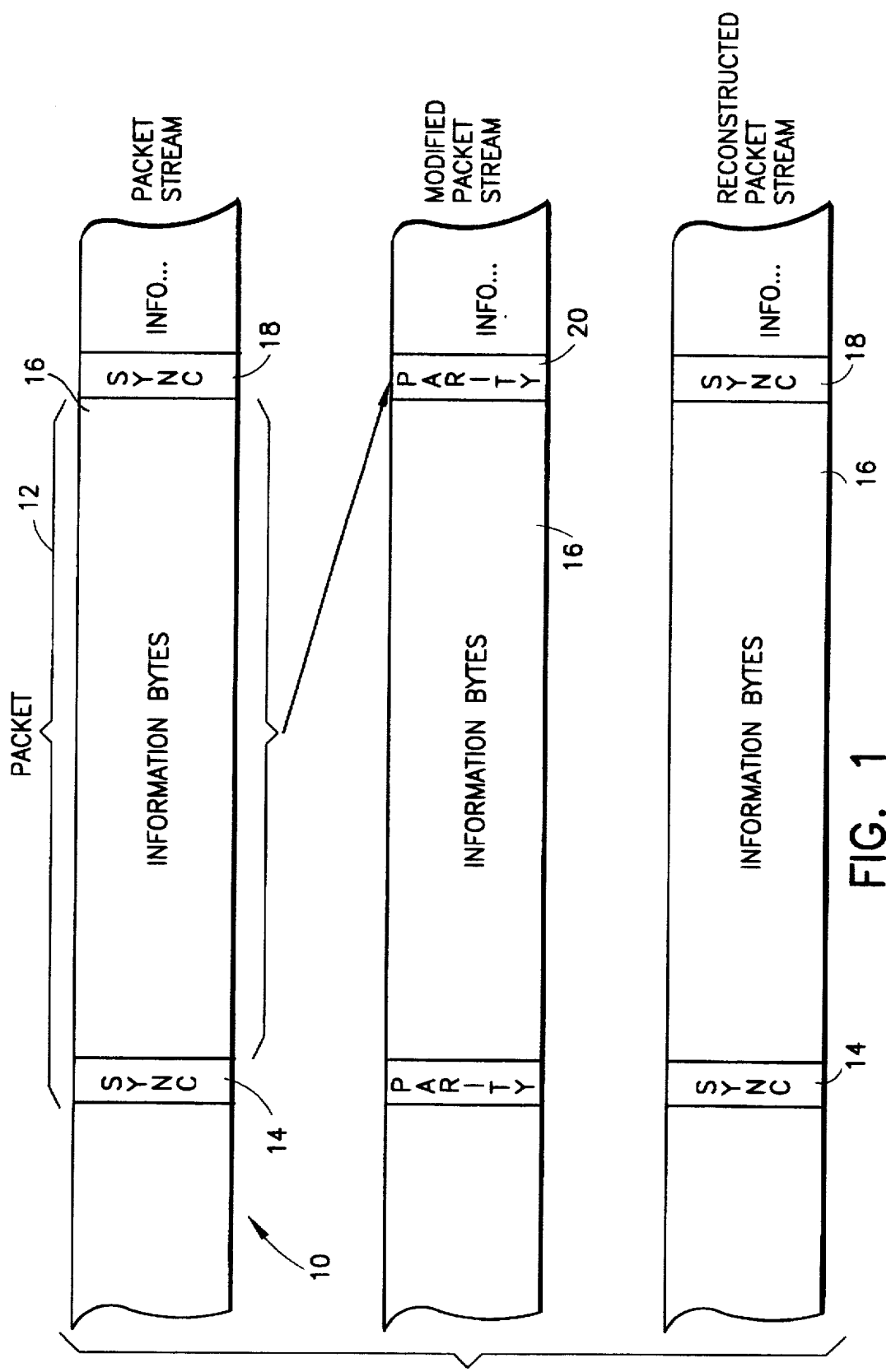
FIG. 1 is a diagrammatic illustration of a packet stream, modified packet stream and reconstructed packet stream in accordance with the present invention.

The present invention will be described herein primarily in connection with the communication of data in accordance with the MPEG-2 transport syntax. However, it should be appreciated that the references to the MPEG-2 standard are for purposes of illustration only, and that the invention is also applicable to other transport schemes in which the transport packets include synchronization bits and information bits.

An MPEG encoded data stream consists of a continuous stream of packets each containing 188 bytes. The data stream is transmitted in serial fashion, most significant bit (MSB) first. The first byte of a packet is specified to be a sync word having a value 01000111 (0×47 in hexadecimal notation). The sync word is intended for use by a decoder to achieve alignment to packet boundaries.

The present invention incorporates an additional layer of processing to utilize the information bearing capacity of the sync word. In addition to the packet alignment information supplied by this word, additional error detection capability is realized in accordance with the present invention by replacing the sync word with a parity checksum. The processing necessary to accomplish this is performed at the transcoder and constitutes the outer most layer of encoding.

In the illustrated MPEG embodiment, the parity checksum is computed over the adjacent 187 bytes which constitute the information bits (as distinguished from the sync bits) of the immediately preceding MPEG packet. By replacing the sync word in one MPEG packet with a parity checksum for the information bits of the preceding MPEG packet, it is possible to simultaneously obtain packet synchronization and error detection of the information in the preceding packet. The decoder computes a sliding checksum on the serial data stream, using the detection of a valid codeword in place of a correlator function to detect the start of a packet. Once a locked alignment condition is established, the absence of a valid codeword at the expected location will indicate an errored packet condition. The error flag of the packet can then be set to indicate an errored data condition to the data processor. As the data is passed out of the decoder, the normal sync word can be reinserted in place of the checksum to provide a standard MPEG) data stream.

the sync byte 18 of the next packet in the stream. This enables the parity code 20 to verify the integrity of the preceding information bytes 16 as well as to obtain packet synchronization.

After the modified packet stream has been acquired and error detection has been completed at the decoder, the original packet stream can be reconstructed as illustrated at the bottom of FIG. 1. In order to do this, the parity codes are replaced with the original synchronization bytes (e.g., the MPEG sync word 01000111) so that the packet stream will appear in its original form to subsequent decoder processes.

Figure 2:
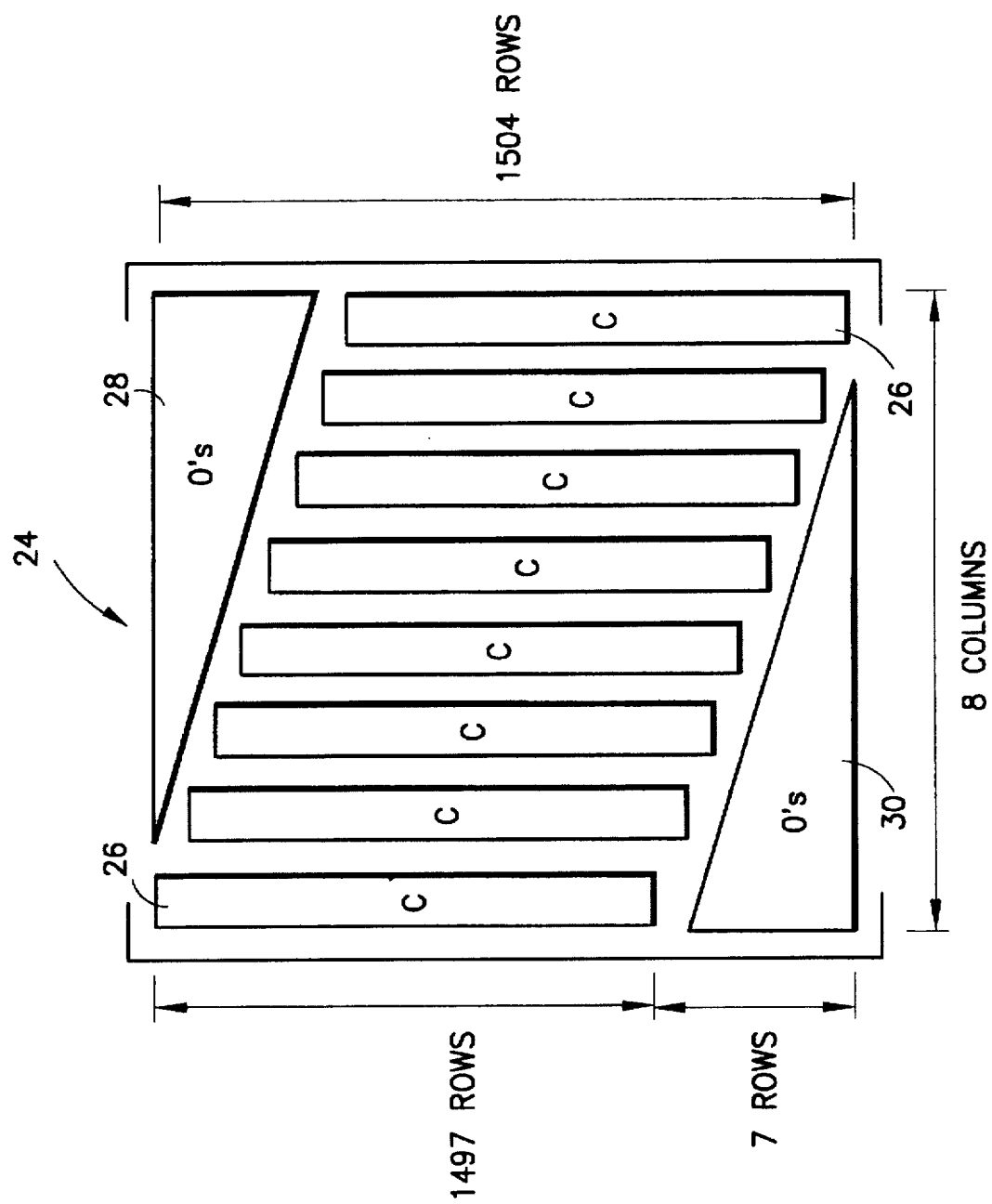
FIG. 2 is a diagrammatic illustration of a parity check matrix in accordance with the present invention.

FIG. 2 illustrates a parity check matrix P generally designated 24 which can be used by the decoder to identify a valid codeword. The code is designed such that when a valid codeword is multiplied against the parity check matrix, a positive match is indicated when the calculated product produces a 0×47 (hexadecimal) result. This enables the utilization of conventional MPEG hardware to identify and synchronize to the standard MPEG sync word. The parity check calculation constitutes a preprocessing step which immediately precedes the conventional hardware.

The parity check matrix 24 is arranged such that it contains eight identical column structures 26. The replicated column structure (designated C) contains 1,497 bits of data for an MPEG embodiment. Proceeding from the left-most column in FIG. 2, the 1497-bit column C is duplicated in subsequent columns of the matrix, shifted down by one bit position in a circular fashion. In this way, the bit positions unoccupied by the column data are filled with zeros, as designated by reference numeral 28 at the top of the matrix and reference numeral 30 at the bottom thereof. An example of the contents of the 1497-bit columns 26 that can be used to form the parity check matrix 24 is illustrated in Table 1. All entries in the table are in hexadecimal format, except for the last entry which is a single binary one. The upper left entry in the table represents the top bit of the column C, and the lower right entry represents the bottom bit of the column.

TABLE 1

| C = | [ b0f3 | 857f | 97a5 | 0ddb | eba0 | caa3 | 58c1 | 2da9 | a7ee | 67b2 |
|---|---|---|---|---|---|---|---|---|---|---|
| | 1039 | 2627 | 5688 | a47c | 05c7 | 78b3 | 61e7 | 0aff | 2f4a | 1bb7 |
| | d741 | 9546 | b182 | 5b53 | 4fdc | cf64 | 2072 | 4c4e | ad11 | 48f8 |
| | 0b8e | f166 | c3ce | 15fe | 5e94 | 376f | ae83 | 2a8d | 6304 | b6a6 |
| | 9fb9 | 9ec8 | 40e4 | 989d | 5a22 | 91f0 | 171d | e2cd | 879c | 2bfc |
| | bd28 | 6edf | 5d06 | 551a | c609 | 6d4d | 3f73 | 3d90 | 81c9 | 313a |
| | b445 | 23e0 | 2e3b | c59b | 0f38 | 57f9 | 7a50 | ddbe | ba0c | aa35 |
| | 8c12 | da9a | 7ee6 | 7b21 | 0392 | 6275 | 688a | 47c0 | 5c77 | 8b36 |
| | 1e70 | aff2 | f4a1 | bb7d | 7419 | 546b | 1825 | b534 | fdcc | f642 |
| | 0724 | c4ea | d114 | 8f | a'b1] | | | | | |

FIG. 1 illustrates the modification of a transport packet stream in accordance with the present invention. A packet stream 10, such as an MPEG packet stream, is formed from successive packets 12 each having r sync bits 14 followed by k information bits 16. In the MPEG format, the sync bits 14 comprise an eight-bit byte (r=8) followed by 187 eight-bit information bytes 16 (k=1496).

In order to enable both synchronization and error detection in accordance with the present invention, the sync bits 18 from a following packet are replaced with parity bits 20 to form a modified packet stream. The parity code 20 is an r bit checksum derived from the information bytes 16 of the preceding packet 12. Thus, whereas packet 12 comprises sync byte 14 followed by information bytes 16, the parity code 20 in the modified packet stream is in the position of In interpreting the matrix, let:

$R$ = received MPEG-2 packet, with 187 bytes followed by the checksum byte, for a total of 1504 bits
 = row vector of length 1504 bits
 = [first bit of packet, . . . most recent received bit].

Then, $S = PR$, where
$S$ = row vector of length 8 bits.
A valid received codeword is indicated when
$S = [0100\ 0111] = 0 \times 47$.

By examination of the parity check matrix 24, and column C set forth in Table 1, it can be seen that each bit of the computed checksum can be derived from an FIR structure, consisting of 1497 taps. The same FIR structure can be used to compute all eight parity bits since each column of the parity check matrix is offset by one bit position, but otherwise identical. The decoder implementation can therefore consist of a single 1497 tap FIR, computing each parity bit in a serial fashion. This result is computed over a binary field, and consequently all additions represent exclusive-OR operations and each tap coefficient is either a one or a zero.

Such an FIR implementation of the decoder is desirable so that errors introduced by either the communication channel or any soft upset mechanism do not propagate indefinitely. This structure will guarantee that error conditions flush out within the space of a packet.

Figure 3:
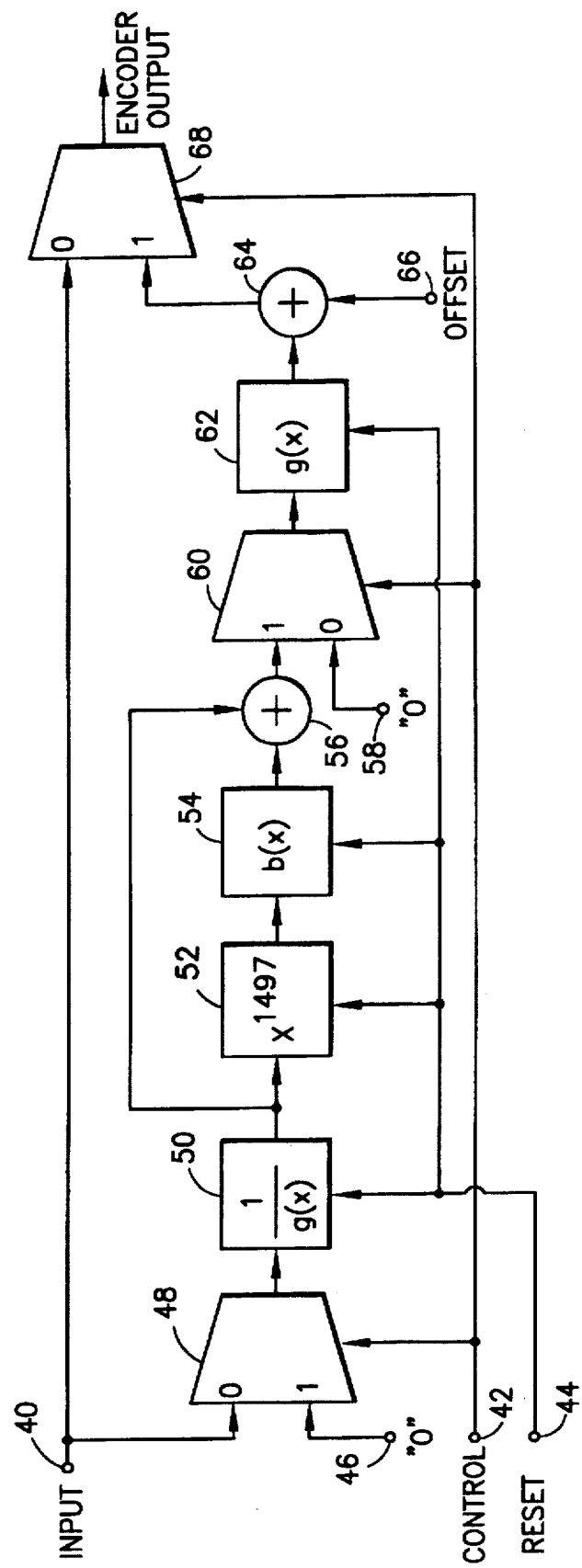
FIG. 3 is a block diagram of an encoder in accordance with the present invention.
Figure 4:
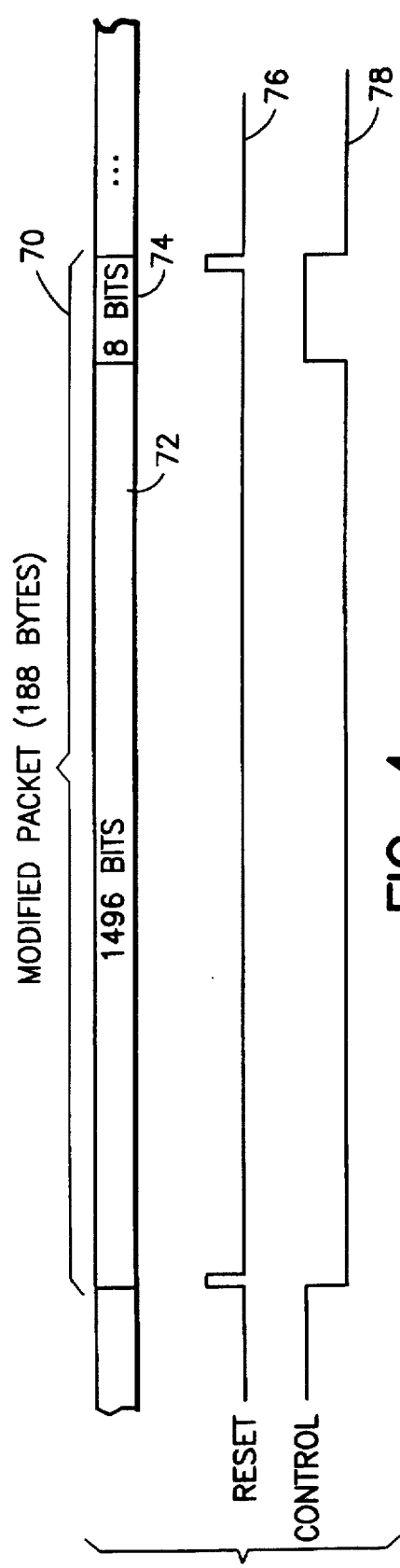
FIG. 4 is a timing diagram illustrating the reset and control signals used in the encoder of FIG. 3.

FIG. 3 is a block diagram illustrating an encoder useful in accordance with the present invention. When the invention is used in connection with, e.g., digital cable television services, the encoder will be implemented in a transcoder at the cable television headend. The data stream to be encoded (1504 bits per packet in an MPEG implementation) is input via terminal 40. A modified packet structure 70 produced by the encoder of FIG. 3 is illustrated in FIG. 4. The modified packet (in an MPEG implementation) comprises 188 bytes of data. Of these, portion 72 comprises 1496 bits of information data (187 bytes) and portion 74 comprises the eight bits of parity data inserted by the encoder of FIG. 3. A reset signal 76 is input to the encoder via terminal 44. A control signal 78 is input to the encoder via terminal 42. In response to the control signal, the information bits 72 will be output from the encoder via selector 68 without modification. The encoder computes the parity bits 74 and inserts them into the modified packet in response to the control signal 78 going high. At this point, selector 68 will output the parity bits from exclusive-OR gate 64 instead of the synchronization byte carried in the original packet input via terminal 40. Selector 48 is actuated by the control signal to provide the input data packet to the FIR filter, which is implemented using components 50, 52, 54 and 62. Each of these components is reset at the packet boundaries by the reset signal input via terminal 44.

The encoder of FIG. 3 implements a systematic linear block code (LBC), in which the information bits 72 of the packet are processed to produce an eight-bit checksum. The checksum 74 is appended to the end of the information bits 72, as illustrated in FIG. 4.

The core function, including 1/g(x), the delay buffer 52 and the polynomial function b(x) of the encoder is identical to the FIR function implemented in the decoder, discussed below in connection with FIGS. 5–8. Since packet alignment is already known, the delay buffer 52 can be replaced by a shift register which stores the first seven bits of a 187-byte data word. After 1497 bits have been passed through the core function 50, these seven bits can then be shifted into the polynomial function 54, providing a correct output which is then summed with the bits shifted out of block 50. These combined bits are then passed through box 62, which implements the polynomial function g(x) to form an eight-bit result.

The eight-bit result out of block 62 can be scaled by an offset value input via terminal 66 to an exclusive-OR gate 64. If the offset value is set to 0×67 (hexadecimal), which exclusively ORs each respective bit output from block 62, a 0×47 (hexadecimal) result will be produced by the decoder when a valid codeword is detected. This result is the same as the MPEG codeword (01000111) which simplifies the decoder hardware by enabling the use of MPEG compatible components. If no offset were added by the encoder, then the decoder would be required to detect eight successive zeros, which has relatively poor autocorrelation characteristics and would increase the mean time required to achieve synchronization. The final computed eight-bit result output from exclusive-OR gate 64 represents the checksum and is appended to the end of the 187-byte (1496 bit) information word 72 via selector 68.

Figure 5:
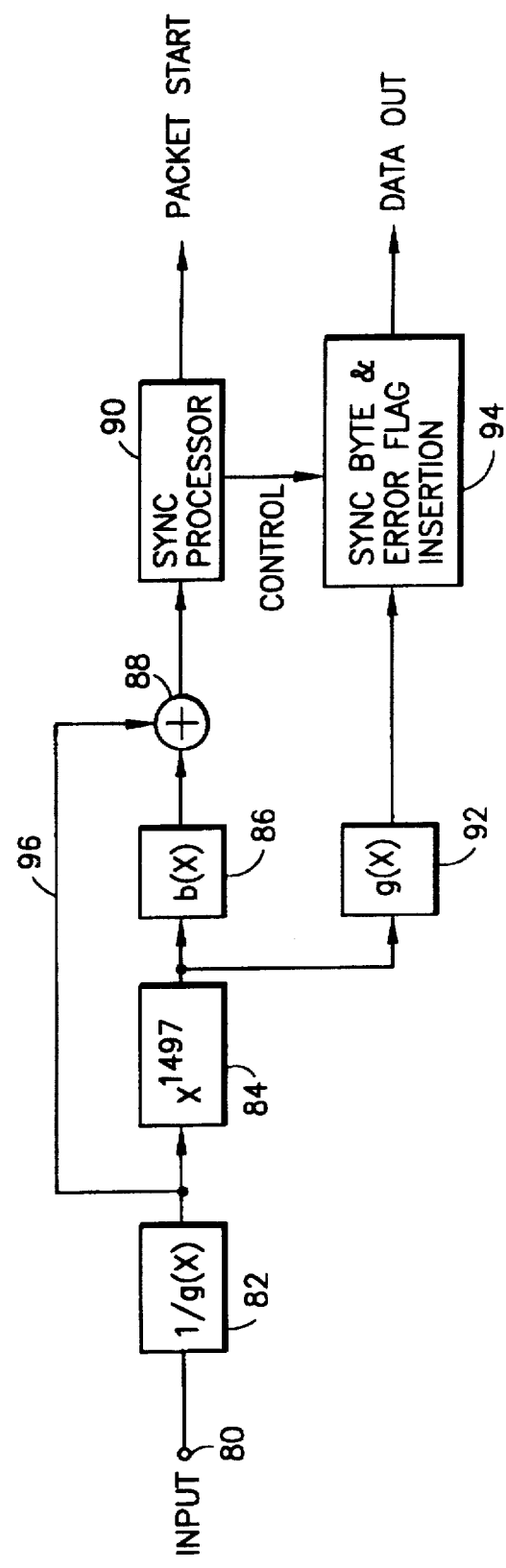
FIG. 5 is a block diagram of a decoder in accordance with the present invention.

FIG. 5 is a block diagram of an efficient structure that can be utilized to decode the data stream output by the encoder of FIG. 3. The decoder structure provided by the present invention results in a drastic reduction in hardware requirements over a conventional FIR structure. This is accomplished with an eight-tap infinite impulse response (IIR) feedback shift register (which generates a pseudo random sequence of maximal length), concatenated with an eight-tap FIR structure. The combined structure is implemented to realize a response equivalent to a 1497-tap FIR filter. The hardware implementation still requires the use of a 1497-bit delay buffer, but this is still much more economical to implement (e.g., with a random access memory based structure) compared to any shift register based approach. Power consumption is also greatly reduced since only a small number of circuit nodes will toggle over any clock period.

The decoder input bitstream is applied to the IIR filter 82 via input terminal 80. The function provided by the IIR filter is described as 1/g(x). The output bits are subsequently processed by an FIR function containing a single tap at the input to a 1497-bit buffer 84. At the output of the buffer 84, an additional eight taps are described by the function b(x), illustrated as block 86. The output of this composite filter produces the desired 1497 tap FIR response and is input via exclusive-OR 88 to a sync processor 90, which attempts to identify the sync word. The output of the IIR filter is fed forward via line 96 as the other input to exclusive-OR 88. Upon identifying the sync word, sync processor 90 will output a packet start signal designating the commencement of successive packets in the input bitstream.

During acquisition, sync processor 90 functions in a mode that is similar to a standard MPEG sync detector. A shift register is used to store the most recent eight bits output from the filter structure, and these bits are examined for an occurrence of the 0×47 (hexadecimal) sync word. Once packet alignment has been established by the acquisition state machine, sync processor 90 will continue to attempt to locate the sync word at the expected time. If the sync word is absent, an error flag bit will be set in the delayed packet data stream. If any input bit originated from an errored block as identified by an error correcting code, e.g., a Reed-Solomon (R/S) code, an error latch will be set that causes the decoder to set the error flag of any packets that are output containing errored bits. This error latch will reset itself at the start of the next packet boundary. Reed-Solomon and other error detection codes and their implementation are well known in the art.

If the error flag of the current packet was previously set by the transcoder due to any errors, such as satellite transmission errors, the contents of the error flag will remain high at the output of the decoder.

The decoder input bitstream is reconstructed at the output of the delay buffer 84 by processing the delayed data by the generator polynomial g(x) as indicated at box 92. This is the inverse of the IIR filter function 1/g(x). The data must be taken from the output of the packet delay buffer, so that detected data errors can be used to set the error flag corresponding to the packet in which they occurred.

As noted above, in an MPEG implementation it is advantageous to replace the parity code 74 inserted at the encoder with the standard MPEG synchronization byte once the parity code has achieved its purpose of acquiring synchronization and detecting errors. The sync byte is reinserted, together with any necessary error flags, in the recovered data stream by sync byte and error flag insertion circuit 94. This circuit is responsive to a control signal from sync processor 90 which identifies the packet boundary at which the sync byte is to be reinserted. The reconstructed packet stream is output from circuit 94 ("data out").

Figure 6:
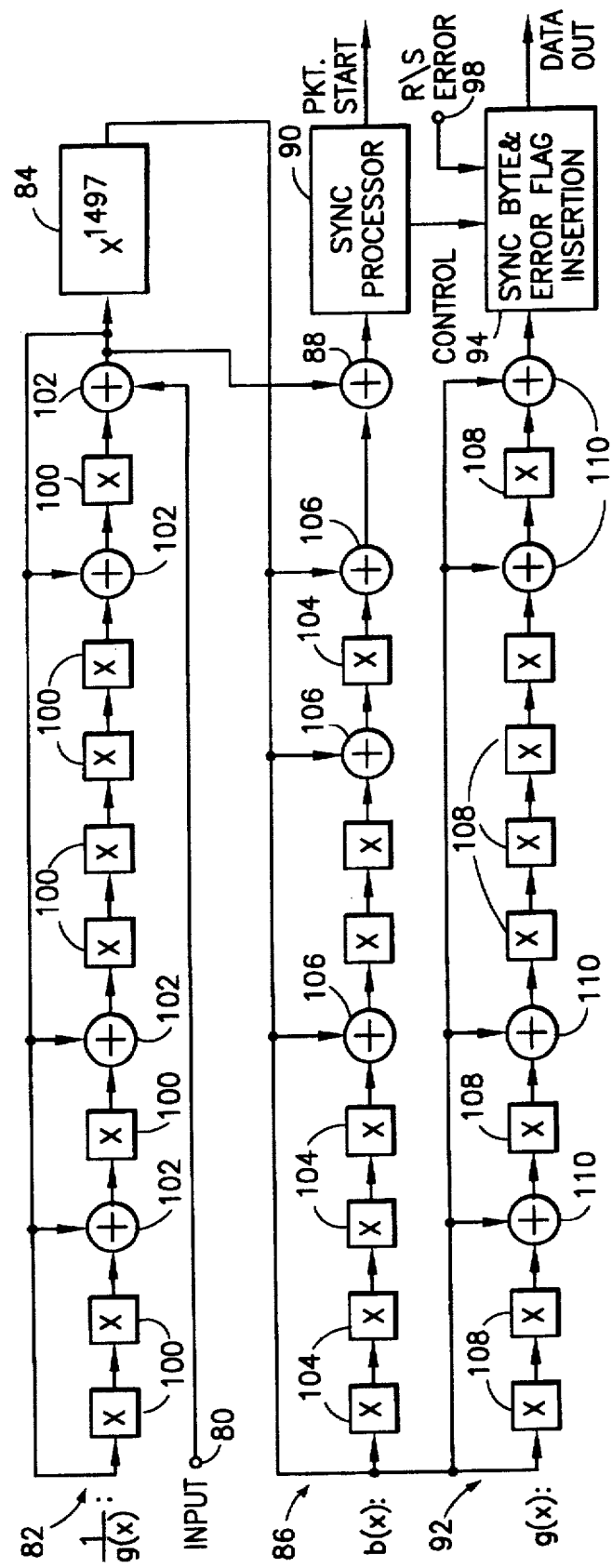
FIG. 6 is a block diagram illustrating the decoder of FIG. 5 in greater detail.

FIG. 6 is a more detailed block diagram of the decoder filter shift registers. The IIR filter 82 comprises a sequence of one-bit delays (x) 100 and exclusive-OR gates 102. The polynomial function b(x) provided by box 86 is implemented using a plurality of one-bit delays 104 and exclusive-OR gates 106. Similarly, the generator polynomial g(x) provided by block 92 is implemented using one-bit delays 108 and exclusive-OR gates 110. The remaining components illustrated in FIG. 6 are the counterparts of the same components illustrated in FIG. 5. FIG. 6 also illustrates a terminal 48 for inputting the supplemental (e.g., R/S) error information to the sync byte and error flag insertion circuit 94.

Figure 7:
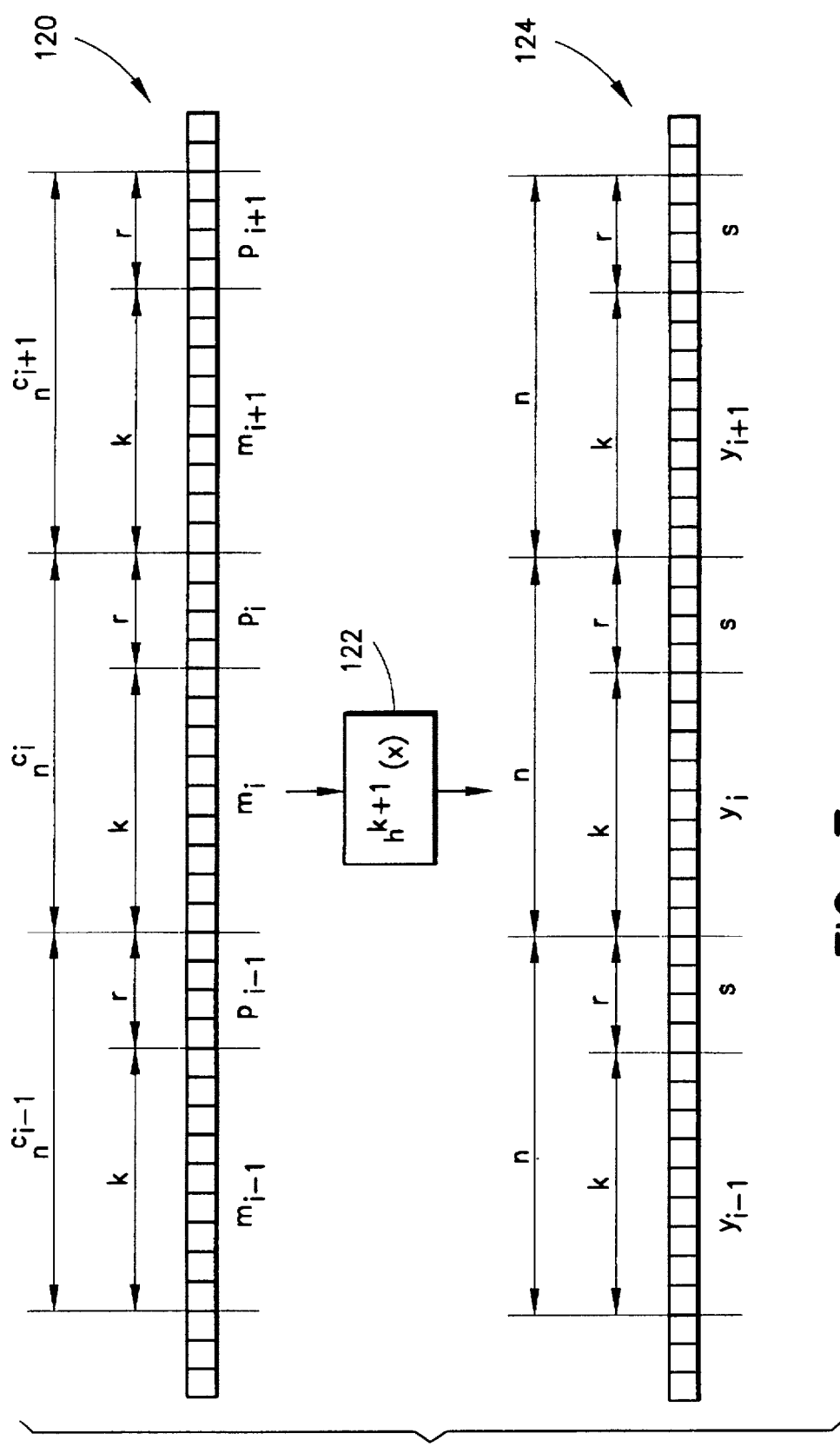
FIG. 7 is a diagrammatic illustration showing the function of the syndrome calculator in accordance with the present invention.
Figure 8:
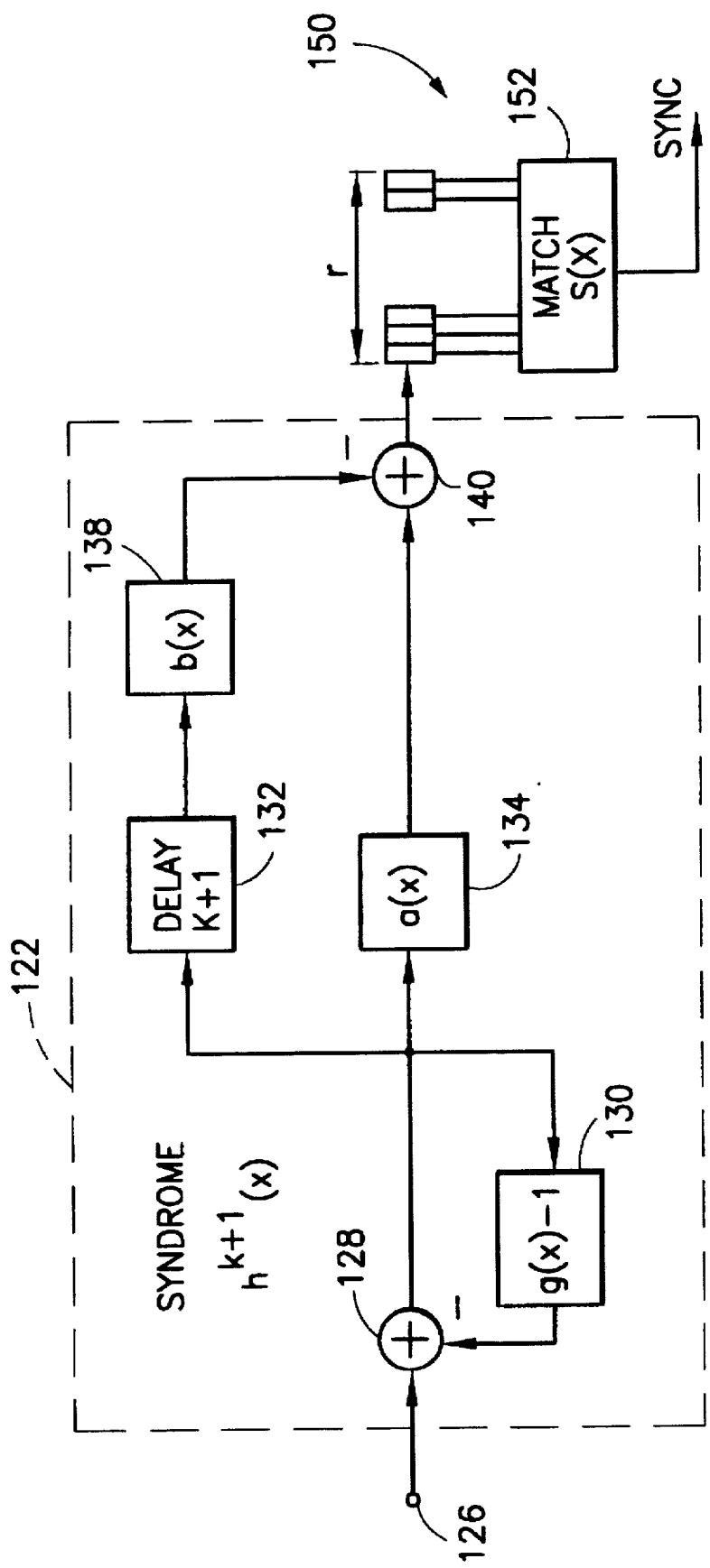
FIG. 8 is a block diagram illustrating a one bit in, one bit out finite impulse response (FIR) filter used as a syndrome calculator with a shift register used for signal acquisition and synchronization purposes coupled to the output thereof.

FIGS. 7 and 8 are useful in describing the theory behind the decoder of the present invention, and more particularly the simplified FIR filter design used at the decoder for calculating syndromes (i.e., the parity bits) from the transport packets. In the following discussion, each transport packet is considered to be a linear block coded codeword $C_i$.

A binary linear block code (LBC) $C \subset F_2^n$ with parameters (n, k) consists of a k dimensional subspace of the set of binary n-tuples $F_2^n$. Such a space can be described by a set of k basis vectors placed in a k×n generator matrix $$G = \begin{pmatrix} g_{1,1} & g_{1,2} & \cdots & g_{1,n} \\ g_{2,1} & g_{2,2} & \cdots & g_{2,n} \\ \cdot & \cdot & \cdots & \cdot \\ \cdot & \cdot & \cdots & \cdot \\ \cdot & \cdot & \cdots & \cdot \\ g_{k,1} & g_{k,2} & \cdots & g_{k,n} \end{pmatrix}$$

Given a generator matrix, a (linear) encoder can be constructed via matrix multiplication $$c = mG$$

where $m \in F_2^k$ is a binary k-tuple. If the first k columns of G is the identity matrix, we say that G represents a systematic encoder. Note that a given LBC C has many generator matrices (and encoders).

An alternate description of a code C is given by a set of r=n−k linearly independent parity-check equations that can be expressed in terms of a parity-check matrix H, a r×n binary matrix. A binary vector of length n is a codeword if and only if $$(c_0, c_1, \ldots, c_{n-1}) \begin{pmatrix} h_{1,1} & h_{2,1} & \cdots & h_{r,1} \\ h_{1,2} & h_{2,2} & \cdots & h_{r,2} \\ \cdot & \cdot & \cdots & \cdot \\ \cdot & \cdot & \cdots & \cdot \\ \cdot & \cdot & \cdots & \cdot \\ h_{1,n} & h_{2,n} & \cdots & h_{r,n} \end{pmatrix} = (0, 0, \ldots, 0)$$

or
$$cH^t = 0.$$

Again, a given LBC C has many parity-check matrices.

The space spanned by the rows of a given parity-check matrix H for a code C form an (n, r) LBC called the dual code. This code is described by $$C^\perp = \{d \in F_2^n | d \cdot c = 0 \text{ for all } c \in C\}.$$

A coset of a LBC is obtained via solutions to the equation $$cH^t = S$$

where S is a fixed binary vector of length r.

To encode onto a coset of a LBC, a constant vector can be added $$c = mG + \sigma$$

where $\sigma H^t = S$. For a systematic encoder, the constant vector $\sigma$ can always be chosen to be zero in its first k coordinates (thus a constant is added to the parity checks only).

Given a binary polynomial $$g(x) = 1 + g_1 x + g_2 x^2 + \ldots + g_{r-1} x^{r-1} + x^r,$$

of degree r, the power series $$\frac{1}{g(x)} = (x) = \sum_{j=0}^{\infty} f_j x^j$$

is defined by the relationship $$g(x)f(x) = 1.$$

Note that the power series f(x) forms a periodic sequence, that is $$f(x) = f^p(x) \sum_{i=0}^{\infty} x^{iP}$$

$$= \frac{f^p(x)}{1 - x^P},$$

where P is the (fundamental)period of f(x) and $$f^p(x) = \sum_{j=0}^{P-1} f_j x^j$$

represents the truncated power series with P terms. It is well known that the maximum period $2^r - 1$ (thus $P \leq 2^r - 1$) is achieved if and only if g(x) is a primitive polynomial; in this case, f(x) is said to be a maximal length, pseudo-random (PN) sequence.

Closely associated with the power series f(x) is the difference equation $$y_j = w_j - \sum_{i=1}^{r} g_i y_{j-i}$$

$$= \sum_{i=0}^{\infty} f_i w_{j-i},$$

which describes a linear, time-invariant, causal finite state system with input sequence $w_j$, output sequence $y_j$ and impulse response $f_j$.

Similarly, a rational function (i.e., ratio of polynomials )

$$\frac{a(x)}{g(x)} = e(x) = \sum_{j=0}^{\infty} e_j x^j$$

is defined by the polynomial equation $$g(x)e(x) = a(x).$$

The power series e(x) implies the difference equation $$y_j = \sum_{m=0}^{degree(a)} a_m w_{j-m} - \sum_{i=1}^{r} g_i y_{j-i}$$

$$= \sum_{i=0}^{\infty} e_i w_{j-i}.$$

If $f(x)=1/g(x)$ and $m \geq 0$ is any non-negative integer then the delayed power series ($e_j=F_{j-m}$, $j \geq 0$)

$$e(x) = \sum_{j=0}^{\infty} f_{j+m} x^j = \frac{a(x)}{g(x)}$$

for some $a(x)$ of degree less than r ($a(x)$ is easily determined from the polynomial equation $g(x)e(x)=a(x)$). Similarly, for the non-negative integer $k>0$ the truncated power series (a polynomial)

$$h^{k+1}(x) = \sum_{j=0}^{k} f_{j+m} x^j = \frac{a(x) - x^{k+1} b(x)}{g(x)}$$

for some $b(x)$ of degree less than r ($b(x)$ is easily determined from the polynomial equation $g(x)h^{k+1}(x)=a(x)-x^{k+1}b(x)$). The polynomial $h^{k+1}(x)=h_0+h_1 x+h_2 x^2+ \ldots +h_k x^k$ represents the truncated power series spanning the k+1 terms $\{f_m, f_{m+1}, f_{m+2}, \ldots, f_{m+k}\}$, where $h_j = f_{m+j}$ for $j=0, 1, \ldots, k$, and $h_j=0$ for $j>k$. The difference equation, in this case, $$y_j = \sum_{m=0}^{degree(a)} a_m w_{j-m} - \sum_{i=0}^{degree(b)} b_i w_{j-(k+1)-i} - \sum_{i=1}^{r} g_i y_{j-i}$$

$$= \sum_{i=0}^{k} h_i w_{j-i}$$

corresponds to a sliding window or finite impulse response (FIR) system. Note that this filter can be implemented (using the first difference equation) with a number of terms that has $\|a(x)\|+\|b(x)\|+\|g(x)\|$ terms rather than $\|h^{k+1}(x)\|$ terms (where $\|r\|$ is the Hamming weight of the polynomial). This is very important in implementing the single bit in, single bit out decoder FIR filter (syndrome calculator) of the present invention since the polynomials $a(x)$, $b(x)$, $g(x)$ are small degree (8 or less) and the degree of $h^{k+1}(x)$ is large.

In implementing the present invention, it is desired to generate LBCs for which the parity check equations can be implemented by a single FIR filter. Let $h^{k+1}(x)$ be a polynomial of degree k with non-zero constant term ($h_0=h_k=1$). Then $$H = \begin{pmatrix} h_k & h_{k-1} & \cdots & \cdots & \cdots & h_0 & 0 & 0 & \cdots & 0 \\ 0 & h_k & \ddots & \cdots & \cdots & h_1 & h_0 & 0 & \cdots & 0 \\ \cdot & \cdot & & \cdot & & \cdot & & \cdot & & \cdot \\ \cdot & \cdot & & \cdot & \cdots & \cdot & & \cdot & \cdots & \cdot \\ \cdot & \cdot & & \cdot & & \cdot & & \cdot & & \cdot \\ 0 & 0 & \cdots & h_k & \cdots & h_{r-1} & h_{r-2} & h_{r-3} & \cdots & h_0 \end{pmatrix}$$

defines an FIR-parity-check LBC. With such an FIR-parity-check LBC, codewords, $C_i(x)$, that are concatenated together $$w(x) = \sum_{i=0}^{\infty} c_i(x) x^{in}$$

can be synchronized by passing w(x) though the FIR filter with response $h^{k+1}(x)$, $$s(x) = h^{k+1}(x)w(x) = \sum_{i=0}^{\infty} (y_i(x) + x^k s(x)) x^{in}$$

where each $y_i(x)$ has degree less than k. This is illustrated in FIG. 7, in which the $c_i$ terms define successive codewords, each having n bits comprising k information bits and r parity bits. The codewords form a packet stream 120 with each packet comprising message bits $m_i$ and parity bits $p_i$. After processing by the syndrome calculator 122, a data stream 124 results in which each packet comprises the desired synchronization word s, and the terms $y_i$, which are ignored.

The syndrome sequence S(x) has the constant polynomial s(x) (a polynomial of degree less than r that determines which coset of the LBC is used) periodically embedded at the end of each n-block (in the absence of channel errors). Thus by correlating the syndrome sequence S(x) with the constant polynomial s(x), synchronization can be established and maintained. By using a systematic encoder, the data is recovered directly from the concatenated sequence w(x). Furthermore, once synchronization has been established, the syndrome can be used to detect errors in the data whenever the fixed polynomial s(x) fails to appear at the anticipated time. Finally, by using an FIR parity check, the syndrome former is self synchronizing (i.e., the initial conditions of the syndrome are resolved automatically) and has limited error propagation (the effect of an error is limited to the length of the FIR window, K+1 bits).

To choose the response $h^{k+1}(x)$, a recursive solution is required. Once a recursion polynomial g(x) is selected, a suitable a(x) and b(x) are determined so that $$h^{k+1}(x) = \frac{a(x) - x^{k+1} b(x)}{g(x)}$$

with $h^{k+1}(x)$ having a non-zero constant term and degree k, with the first ($h_0$) and last ($h_k$) terms being 1 ($h_0=h_k=1$). Once g(x) is specified, only certain choices of a(x) and b(x) will work.

FIG. 8 is a block diagram illustrating the components of the syndrome calculator and the synchronization detection. It is important to note that the effects of the initial conditions in the recursive portion of the circuit 122 (i.e., the feedback block 130 that implements the 1/g(x) function) have a finite effect on the output. This is a direct consequence of the fact that the polynomial $f(x)=a(x)-x^{K+1}b(x)$ is divisible by g(x) and that the operations that implement these functions operate on the output of the recursive part of the circuit. For example, if the initial conditions are non-zero in the 1/g(x) circuit, and the input at terminal 126 is constantly zero, then the output of the recursive portion 130 is the pseudo random (PN) sequence generated by 1/g(x). However, within n steps, the output of the syndrome calculator will constantly produce zero at the output. This property also ensures that the effects of channel errors on the output of the syndrome will be restricted to the k+1 span of the impulse response of the syndrome function.

As can be seen in FIG. 8, the syndrome calculator 122 implements the function $h^{k+1}(x)$ described above. The a(x) polynomial 134 and b(x) polynomial 138 are added in exclusive-OR gate 140 to provide the actual syndromes. The input to the polynomial 138 is delayed by delay element 132.

The output of the syndrome filter is shifted into a register 150 of length r, where a match to the desired sync pattern s(x) is made in comparator 152. The resultant sync signal is then used to establish and maintain synchronization as well as to detect the presence of errors.

Finally, a systematic encoder must be implemented. A simple two pass encoder can be implemented as follows. First, take the k bit message, followed by r zeros, and pass the resulting n bits through a syndrome calculator, producing an n bit output. Throw out the first k outputs and retain the last r bits. These r bits are then passed through a filter with response g(x)/a(x) (this method assumes k>r). The r bits produced from this last filtering summed with a constant r bits (that determines s(x)) determine the parity bits that are to be transmitted. Note that there are simplifications that can be applied here. First, only the first r−1 message bits are needed for the "b(x)" polynomial, there is no need to build a buffer of length k+1 (as required at the receiver).

A common class of (n, k) LBCs used for error detection in a large variety of transmission and storage systems are the cyclic redundancy check (CRC) codes. These codes are best described in terms of polynomial codewords $c(x) \in F_2^n[x]$ (the set of binary polynomials of degree<n) and a generator polynomial g(x) of degree r=n−k. The code $$C = \{c(x) \in F_2^n[x] | c(x) = m(x)g(x), m(x) \in F_2^k[x]\}$$

is all polynomial multiples of the generator polynomial g(x) of degree less than n. A CRC code can be described as an intersection of the ideal generated by g(x) in the ring of polynomials $F_2[x]$.

$$C = <g(x)> \cap F_2^n[x], <g(x)> = \{c(x) \in F_2[x] | c(x) = m(x)g(x), m(x) \in F_2[x]\}.$$

Given the generator g(x), of degree r, and the block length n for a CRC, one can always find polynomials h(x), of degree k=n−r and f(x) of degree n such that g(x)h(x)=f(x) and then $$C = \{c(x) \in F_2^n[x] | c(x)h(x) = 0 \text{ modulo } f(x)\}.$$

C forms an ideal in the quotient ring $F_2[x]/<f(x)>$. If one can solve g(x)h(x)=$x^n$−1 (i.e., f(x)=$x^n$−1) then the CRC is a cyclic code. In this case, the dual code is also a cyclic code with generator $x^k h(x^{-1})$ $$C^\perp = <x^k h(x^{-1})> \cap F_2^n[x]$$

and thus the dual of a cyclic code is a cyclic code. However, for most choices of block length n, it is not possible to solve g(x)h(x)=f(x) with f(x)=$x^n$−1. For example, if g(x) is a primitive polynomial (or the product of a primitive polynomial with x−1, a common form of the generator used in many CRC codes), then the block length n must be divisible by $2^r$−1 ($2^{r-1}$1). For such other values of n, the code C is in fact a shortened cyclic code since one can always find an integer m≥n such that g(x) divides $x^m$−1 and the code C is obtained by shortening the (m, m−r) code $<g(x)> \cap F_2^m[x]$ to the (n, n−r) code $C = <g(x)> \cap F_2^n[x]$.

For a shortened cyclic code, m>n, the polynomial $x^k h(x^{-1})$ does not generate the dual code and in fact the dual code is not the intersection with any ideal in $F_2[x]$. Thus the dual of a shortened cyclic code is not a shortened cyclic code.

As an example, consider the primitive polynomial g(x)= 1+x+$x^3$ of degree r=3 and the block lengths n=6, 7, 8. In the following Table 2, the dimension of the code k is given as well as f(x)=a(x)·$x^{k+1}$b(x)=g(x)h(x) and the value of the smallest cyclic code length m.

TABLE 2

| n | k | a(x) | b(x) | f(x) | h(x) | m |
|---|---|------|------|------|------|---|
| 6 | 3 | 1+x | 1+$x^2$ | 1+x+$x^4$+$x^6$ | 1+$x^3$ | 7 |
| 7 | 4 | 1 | $x^2$ | 1+$x^7$ | 1+x+$x^2$+$x^4$ | 7 |
| 8 | 5 | 1+x | $x^2$ | 1+$x^3$$x^8$ | 1+$x^3$ | 14 | g(x) = 1+x+$x^3$, n = 6, 7, 8

Notice that only in the case n=7 is the code a cyclic code which has a dual that is itself a cyclic code. In the other two cases, n=6, 8 the codes are shortened cyclic codes which have duals that are not shortened cyclic codes.

In connection with the present invention, it has been realized that for reasons of simplifying the syndrome calculation, the dual of a shortened cyclic code offers distinct advantages over the usual CRC technique of using a shortened cyclic code. Thus for example, once g(x) and n have been fixed, the codewords of a CRC would be the set $C_{CRC} = <g(x)> \cap F_2^n[x]$ while the illustrated implementation of the present invention uses the set $C_{FIR-p-c} = (<x^k h(x^{-1})> \cap F_2^n[x])^\perp$. Note that $C_{FIR-p-c} \neq C_{CRC}$ unless the code is a cyclic code (i.e., g(x) divides $x^n$−1). The choice of $C_{FIR-p-c}$ means that the simple syndrome calculation procedure described previously will apply. This would not be possible in general with $C_{CRC}$.

In an MPEG implementation as illustrated in FIGS. 3–6, the packets are 188 bytes (n=1504 bits) long with 187 bytes (k=1496 bits) of data and 1 byte (r=8 bits) of sync word. (Note that $2^8$=1=255 does not divide n=1504). The illustrated embodiment uses the space for the 1 byte sync word to accomplish both synchronization and additional error detection, above that provided by other error detection layers in the transmission system, such as Reed Solomon encoding. This is accomplished via an FIR-parity-check based linear block code, as described above. The parameters of one possible code are (n=1504, k=1496) where:

$$g(x) = 1+x+x^5+x^6+x^8;$$

$$a(x) = 1;$$

$$b(x) = 1+x+x^3+x^7,$$

which is based on a primitive polynomial g(x) of degree 8 (i.e., it produces a PN-sequence of length 255), a constant a(x) and a b(x) with 4 terms.

The system uses a coset of the FIR-parity-check LBC. The sequence chosen s(x)=1+x+$x^2$+$x^6$ (0x47 in Hex) has good auto-correlation properties and is, advantageously, the same as the conventional MPEG sync word. This result is achieved by adding the offset σ(x)=1+x+$x^2$+$x^5$+$x^6$ (0x67 in Hex) to the parity check byte at the transmitter.

It should now be appreciated that the present invention provides a method and apparatus for achieving synchronization and detecting errors in a packetized data stream. Although the invention has particular applicability to the synchronization and error detection in an MPEG transport packet scheme, it is not limited to use with the MPEG format. The invention also provides a unique and economical decoder, in which syndrome calculation is accomplished using a one bit input, one bit output FIR filter. An advantageous class of codes which can be used to generate the parity bits used for the checksum in accordance with the present invention is the class of linear block codes which are duals of shortened cyclic codes.

The inclusion of a parity checksum encoding layer affords a substantial improvement in the error detection capability of the transmission system. A conventional error correction layer (such as a Reed-Solomon layer) alone will detect errored data approximately 85% of the time, whereas the checksum of the present invention alone will provide a detection rate of 99.6%. Combining both detection mechanisms will yield an overall detection rate of 99.94%. This is an important consideration when the system relies on the concealment of errors when operating in high noise environments.

An additional advantage of this encoding scheme is an improvement in the reliability with which packet synchronization is accomplished. The standard sync word approach is vulnerable to repetitive data patterns within the packets which might be falsely acquired as the sync word location. A large measure of this data dependence is removed in the method and apparatus of the present invention by encoding the data itself to provide the synchronization information.

Although the invention has been described in connection with various specific embodiments, it should be understood and appreciated that numerous adaptations may be made thereto without departing from the spirit and scope of the invention, as set forth in the claims. For example, the following additional sets of parity check polynomials (or others) could be used in connection with (n=1504, k=1496) codes:

Selected Parity Check Polynomials for (n = 1504, k = 1496) codes $g(x) = 1 + x^2 + x^3 + x^4 + x^8$
$\quad a(x) = 1 + x + x^2 + x^3 + x^4 + x^6, b(x) = 1 + x + x^2 + x^3 + x^5 + x^7$
$\quad a(x) = 1 + x + x^3 + x^4 + x^5 + x^6 + x^7, b(x) = 1 + x^2 + x^3 + x^6 + x^7$
$g(x) = 1 + x^3 + x^5 + x^6 + x^8$
$\quad a(x) = 1 + x + x^2 + x^3 + x^4 + x^5, b(x) = 1 + x + x^2 + x^3 + x^5 + x^6 + x^7$
$\quad a(x) = 1 + x^2 + x^3 + x^4 + x^6, b(x) = x^7$
$\quad a(x) = 1 + x + x^2 + x^3 + x^4 + x^5 + x^6, b(x) = 1 + x^2 + x^3 + x^4 + x^5 + x^7$
$\quad a(x) = 1 + x^2 + x^3 + x^5 + x^7, b(x) = 1 + x + x^2 + x^3 + x^4 + x^5 + x^6 + x^7$
$g(x) = 1 + x + x^2 + x^5 + x^6 + x^7 + x^8$
$\quad a(x) = 1, b(x) = x + x^2 + x^4 + x^7$
$\quad a(x) = 1 + x + x^2 + x^3 + x^5 + x^6 + x^7, b(x) = 1 + x + x^3 + x^4 + x^5 + x^6 + x^7$
$\quad a(x) = 1 + x^4 + x^5 + x^6 + x^7, 1\ b(x) = x^7$
$g(x) = 1 + x + x^5 + x^6 + x^8$
$\quad a(x) = 1 + x^4 + x^6 + x^7, b(x) = x^7$
$\quad a(x) = 1 + x + x^2 + x^3 + x^4 + x^5 + x^6 + x^7, b(x) = 1 + x^2 + x^4 + x^6 + x^7$
$g(x) = 1 + x^2 + x^5 + x^6 + x^8$
$\quad a(x) = 1, b(x) = 1 + x + x^3 + x^7$
$\quad a(x) = 1 + x + x^2 + x^3 + x^4 + x^5 + x^6, b(x) = x^7$
$\quad a(x) = 1 + x + x^2 + x^3 + x^6 + x^7, b(x) = 1 + x + x^2 + x^3 + x^4 + x^5 + x^6 + x^7$
$g(x) = 1 + x^2 + x^3 + x^7 + x^8$
$\quad a(x) = 1, b(x) = x + x^2 + x^3 + x^4 + x^5 + x^6 + x^7$
$\quad a(x) = 1 + x^4 + x^6 + x^7, b(x) = x^7$
$\quad a(x) = 1 + x + x^2 + x^3 + x^4 + x^5 + x^6 + x^7, b(x) = 1 + x + x^4 + x^5 + x^6 + x^7$
$g(x) = 1 + x^2 + x^3 + x^5 + x^8$
$\quad a(x) = 1, b(x) = x + x^3 + x^4 + x^5 + x^7$
$\quad a(x) = 1 + x^2 + x^3 + x^4 + x^5 + x^7, b(x) = x + x^2 + x^3 + x^4 + x^5 + x^6 + x^7$
$\quad a(x) = 1 + x + x^2 + x^4 + x^5 + x^6 + x^7, b(x) = x^2 + x^3 + x^4 + x^5 + x^6 + x^7$
$\quad a(x) = 1 + x + x^2 + x^3 + x^4 + x^5 + x^6 + x^7, b(x) = 1 + x^2 + x^4 + x^5 + x^7$
$g(x) = 1 + x + x^2 + x^3 + x^4 + x^6 + x^8$
$\quad a(x) = 1 + x + x^2 + x^3 + x^4 + x^5, b(x) = x^7$
$\quad a(x) = 1 + x + x^2 + x^3 + x^4 + x^5 + x^7, b(x) = 1 + x + x^2 + x^4 + x^5 + x^7$
$g(x) = 1 + x + x^6 + x^7 + x^8$
$\quad a(x) = 1, b(x) = 1 + x + x^2 + x^3 + x^5 + x^6 + x^7$
$\quad a(x) = 1 + x + x^3 + x^5 + x^6 + x^7, b(x) = 1 + x + x^2 + x^3 + x^4 + x^5 + x^6 + x^7$
$g(x) = 1 + x^3 + x^5 + x^7 + x^8$
$a(x) = 1 + x + x^2 + x^3 + x^4, b(x) = 1 + x + x^2 + x^3 + x^4 + x^5 + x^6 + x^7$
$a(x) = 1 + x + x^2 + x^3 + x^4 + x^6 + x^7, b(x) = x + x^2 + x^3 + x^5 + x^6 + x^7$
$a(x) = 1 + x + x^2 + x^3 + x^5 + x^6 + x^7, b(x) = x^7$
$a(x) = 1 + x + x^2 + x^3 + x^5 + x^6 + x^7, b(x) = 1 + x + x^2 + x^4 + x^5 + x^7$
$g(x) = 1 + x + x^2 + x^7 + x^8$
$\quad a(x) = 1 + x + x^2 + x^4 + x^5 + x^6 + x^7, b(x) = x^7$
$\quad a(x) = 1 + x + x^2 + x^3 + x^4 + x^5 + x^6 + x^7, b(x) = 1 + x + x^2 + x^4 + x^6 + x^7$
$g(x) = 1 + x^2 + x^3 + x^6 + x^8$
$\quad a(x) = 1, b(x) = 1 + x + x^3 + x^7$
$\quad a(x) = 1 + x + x^3 + x^5 + x^7, b(x) = 1 + x + x^2 + x^3 + x^4 + x^5 + x^6 + x^7$
$g(x) = 1 + x + x^2 + x^3 + x^6 + x^7 + x^8$
$\quad a(x) = 1, b(x) = 1 + x + x^2 + x^3 + x^7$
$\quad a(x) = 1 + x^3 + x^5 + x^6, b(x) = x^7$
$\quad a(x) = 1 + x + x^2 + x^3 + x^4 + x^6 + x^7, b(x) = 1 + x + x^2 + x^4 + x^5 + x^6 + x^7$
$g(x) = 1 + x^2 + x^4 + x^5 + x^6 + x^7 + x^8$
$\quad a(x) = 1, b(x) = x^2 + x^3 + x^4 + x^5 + x^6 + x^7$
$\quad a(x) = 1 + x^2 + x^3 + x^5 + x^6 + x^7, b(x) = 1 + x^2 + x^3 + x^4 + x^5 + x^6 + x^7$
$g(x) = 1 + x^4 + x^5 + x^6 + x^8$
$\quad a(x) = 1 + x + x^4 + x^5 + x^7, b(x) = 1 + x + x^2 + x^3 + x^4 + x^6 + x^7$
$\quad a(x) = 1 + x^2 + x^4 + x^5 + x^6 + x^7, b(x)\ x + x^3 + x^4 + x^5 + x^6 + x^7$

We claim:

1. A method for achieving synchronization and detecting errors in a data stream carrying successive packets of k information bits and r synchronization bits, the synchronization bits of each packet comprising a predefined searchable pattern, comprising the steps of:

locating at least one synchronization pattern in said data stream to enable the boundaries for the k information bits of successive packets to be determined;

replacing the synchronization pattern in each packet with an r-bit parity code derived from a counterpart set of k information bits in said data stream, thereby generating a modified data stream;

communicating said modified data stream to a decoder;

locating at least one of said parity codes in said modified data stream at said decoder to achieve synchronization, thereby enabling the boundaries for the k information bits of successive packets to be determined; and comparing said parity codes to checksums obtained from their counterpart k information bits at said decoder to determine when the information bits in a packet contain an error.

2. A method in accordance with claim 1 wherein:

the synchronization pattern for each packet precedes the k information bits of that packet; and the counterpart set of k information bits for each parity code comprises the k information bits immediately preceding the parity code.

3. A method in accordance with claim 1 wherein said parity code is generated from a linear block code comprising a dual of a shortened cyclic code.

4. A method in accordance with claim 1 wherein said data stream is an MPEG compatible data stream.

5. A method in accordance with claim 4 comprising the further step of scaling said parity codes such that when decoded at said decoder, they will match MPEG synchronization patterns.

6. A method in accordance with claim 4 wherein k=1496.

7. Communication apparatus for enabling a receiver to robustly obtain synchronization and detect errors in a data stream carrying successive packets of k information bits and an r-bit parity code, the parity code of each packet comprising a predefined pattern of bits detectable at said receiver by searching for said pattern and functioning as a checksum for information bits carried in said data stream, said apparatus comprising:

means for inserting the parity codes in said packets prior to communication to said receiver, each of said parity codes being derived from a counterpart set of k information bits in said data stream;

means for communicating said data stream to said receiver after insertion of said parity codes;

means for locating at least one parity code in said data stream at said receiver to achieve synchronization, thereby enabling the boundaries for the k information bits of successive packets to be determined; and means at said receiver for comparing said parity codes to checksums obtained from their counterpart k information bits to determine when the information bits in a packet contain an error.

8. Apparatus in accordance with claim 7 further comprising:

a parity check matrix at said receiver for generating a predefined synchronization pattern from valid parity codes.

9. Apparatus in accordance with claim 8 wherein said predefined synchronization pattern is a standard MPEG synchronization pattern.

10. Apparatus in accordance with claim 7 wherein said data stream contains synchronization patterns prior to insertion of said parity codes, said apparatus further comprising:

means for replacing said synchronization patterns with said parity codes to provide a modified data stream for communication to said receiver.

11. Apparatus in accordance with claim 10, further comprising:

means at said receiver for reconstructing said data stream from said modified data stream by replacing said parity codes with said synchronization patterns.

12. Apparatus in accordance with claim 10 wherein:

each packet commences with one of said synchronization patterns, with the k information bits for the packet following the synchronization pattern for that packet; and each synchronization pattern is replaced with a parity code derived from the k information bits of the preceding packet.

13. Apparatus in accordance with claim 12 wherein said data stream is an MPEG compatible data stream.

14. Apparatus in accordance with claim 13 further comprising:

means for scaling said parity codes such that when decoded at said receiver, they will match an MPEG synchronization pattern.

15. A decoder for a packetized digital data stream in which successive packets each contain k information bits and an r-bit parity code, the parity code of each packet being derived from k bits of information carried by said data stream, comprising:

means for searching said data stream during a signal acquisition phase to locate a parity code contained therein;

means for establishing a synchronization condition based on one or more parity codes located by said searching means;

means for comparing a checksum derived from the k information bits of each packet to the parity code for those k information bits during a tracking phase; and means for signalling an error in the k information bits for a packet when the checksum for those bits does not match the parity code therefor.

16. A decoder in accordance with claim 15 wherein:

each parity code is derived from the k information bits of the immediately preceding packet.

17. A decoder in accordance with claim 15 wherein said parity codes are generated from a linear block code comprising a dual of a shortened cyclic code.

18. A decoder in accordance with claim 15 wherein said data stream is encoded in an MPEG compatible format, said decoder further comprising:

means for replacing the parity code in each packet with an MPEG synchronization pattern.

19. A decoder in accordance with claim 15 further comprising:

means for monitoring said parity codes during said tracking phase; and means responsive to said monitoring means for switching from said tracking phase to said acquisition phase after a predetermined plurality of r-bit patterns considered by said monitoring means to be parity codes are found to be invalid.

20. A decoder in accordance with claim 19 wherein said data stream is encoded in an MPEG compatible format, said decoder further comprising:

means for replacing the parity code in each packet with an MPEG synchronization pattern.

21. A decoder in accordance with claim 20 wherein:

each parity code is derived from the k information bits of the immediately preceding packet; and each synchronization pattern comprises the first r bits in a packet and is followed by the k information bits for that packet.

22. Apparatus for calculating syndromes for linear block coded codewords, comprising:

a finite impulse response filter having an input for receiving a serial bit stream of codeword data, each codeword containing k information bits and r parity bits, said filter having an output for providing a serial bit stream of syndromes, said syndromes comprising a fixed linear combination of a current bit of said codeword data input to said filter and the k previous bits of said codeword data;

wherein said filter has an impulse response $h^{k+1}(x)$, where:

$$h^{k+1}(x) = \frac{a(x) - x^{k+1}b(x)}{g(x)},$$

g(x) is a generator polynomial of degree r describing a recursion to provide an infinite impulse response, and a(x) and b(x) are polynomials chosen such that the polynomial $h^{k+1}(x)$ will be of degree k, have a non-zero constant term $h_0=1$, and have a non-zero final term $h_k=1$ to provide finite impulse responses.

23. Apparatus in accordance with claim 22 wherein said linear block code is a dual of a shortened cyclic code.

24. Apparatus in accordance with claim 22 further comprising:

means coupled to the output of said filter for detecting a synchronization pattern in the serial bit stream of syndromes.

\* \* \* \* \*